United States Patent
Shapira et al.

(10) Patent No.: US 9,514,837 B2
(45) Date of Patent: Dec. 6, 2016

(54) SELECTIVE ONLINE BURN-IN WITH ADAPTIVE AND DELAYED VERIFICATION METHODS FOR MEMORY

(71) Applicant: SanDisk Technologies Inc., Plano, TX (US)

(72) Inventors: Ofer Shapira, Herzliya (IL); Eran Sharon, Rishon Lezion (IL); Idan Alrod, Herzliya (IL)

(73) Assignee: SanDisk Technologies LLC, Plano, TX (US)

( * ) Notice: Subject to any disclaimer, the term of this patent is extended or adjusted under 35 U.S.C. 154(b) by 33 days.

(21) Appl. No.: 14/600,342

(22) Filed: Jan. 20, 2015

(65) Prior Publication Data
US 2016/0211035 A1 Jul. 21, 2016

(51) Int. Cl.
| | | |
|---|---|---|
| G11C 29/04 | (2006.01) | |
| G11C 29/00 | (2006.01) | |
| G11C 16/34 | (2006.01) | |
| G11C 16/14 | (2006.01) | |
| G11C 11/56 | (2006.01) | |
| G06F 11/10 | (2006.01) | |
| G06F 11/07 | (2006.01) | |

(52) U.S. Cl.
CPC ......... *G11C 16/3459* (2013.01); *G06F 11/079* (2013.01); *G06F 11/0751* (2013.01); *G11C 16/14* (2013.01); *G11C 29/04* (2013.01); *G06F 11/1068* (2013.01); *G11C 11/5628* (2013.01); *G11C 29/883* (2013.01)

(58) Field of Classification Search
CPC ............... G11C 29/883; G11C 11/5628; G11C 11/5642; G11C 16/3459; G06F 11/1068
USPC .......................................................... 714/764
See application file for complete search history.

(56) References Cited

U.S. PATENT DOCUMENTS

| | | | | |
|---|---|---|---|---|
| 7,502,977 | B2 * | 3/2009 | Venkatraman | G11C 29/76 365/227 |
| 8,176,382 | B2 * | 5/2012 | Hu | G06F 11/073 714/758 |
| 8,379,454 | B2 * | 2/2013 | Kochar | G11C 16/3459 365/185.19 |
| 8,498,153 | B2 * | 7/2013 | Seong | G11C 11/5628 365/185.03 |

(Continued)

*Primary Examiner* — James C Kerveros
(74) *Attorney, Agent, or Firm* — Martine Penilla Group, LLP

(57) ABSTRACT

A memory is released for use without pre-verification of its memory blocks as being defect free. Some memory blocks are subjected to a verification process when the computer memory is in use in order to verify a minimum number of memory blocks required for high performance program operation as being defect free. The verification process continues as the computer memory is in use in order to maintain the minimum number of memory blocks required for high performance operation in the verified defect free state. A verification mode of either no verification, delayed verification, or immediate verification is applied to memory blocks used for regular performance program operation. Delayed verification is maintained until an ability to recover the stored data is going to be lost. Immediate verification can be performed using bit error rate analysis. Some verification processes are performed using aggressive programming trim and/or multiple word line sensing for faster programming.

20 Claims, 7 Drawing Sheets

(56) References Cited

U.S. PATENT DOCUMENTS

| | | | |
|---|---|---|---|
| 8,661,294 B2* | 2/2014 | Lee ................... | G06F 11/1048 714/38.1 |
| 2007/0043984 A1* | 2/2007 | Mori ................. | G11C 16/0408 714/718 |

* cited by examiner

SELECTIVE ONLINE BURN-IN WITH ADAPTIVE AND DELAYED VERIFICATION METHODS FOR MEMORY

BACKGROUND

1. Field of the Invention

The present invention relates to methods and systems for operating computer memory devices.

2. Description of the Related Art

Non-volatile NAND-based flash memory systems are widely used in modem digital computing devices, such as mobile phones, digital cameras, digital camcorders, computers, and many other digital computing devices. Quality control in flash memory production requires detection and mitigation of flash defects such that the number of defective parts (memory chips) per million (DPPM) is maintained below a threshold value of DPPM set by quality standards. A defective flash memory device is one where the data stored in the memory device becomes unavailable, i.e., cannot be read from the memory device.

One factor that contributes to data loss in flash memory is data corruption caused by physical defects referred to as "flash defects." The term "defect" is used herein to refer to such "flash defects." A defect is of concern when the physical damage associated with the defect causes changes to the stored data that cannot be corrected by implemented protection mechanisms such as error correction code (ECC) processes. A given defect may cause corruption of data in either one word line or multiple word lines simultaneously. Also, defects are "grown" in the sense that a given defect develops when electrical field stress is applied to memory cells during read, program, and erase operations, until a breakdown point is reached where the defect has grown to the point that data cannot be retrieved from the memory cells affected by the defect. Upon reaching the breakdown point, the word line that contains the memory cell affected by the defect becomes unusable, and possibly other neighboring word lines also become unusable depending on the physical damage associated with the defect. It is within this context that the present invention arises.

SUMMARY

In one example embodiment, a method is disclosed for operating a computer memory. The method includes an operation for determining an amount of verified memory blocks in the computer memory that are available for use in a program operation. Each verified memory block has been verified as having no defects. The operation for determining the amount of verified memory blocks is performed during normal operation of the computer memory. The method also includes an operation for determining that the amount of verified memory blocks is less than an amount of memory blocks required to support a high performance data program operation. In the high performance data program operation, data is programmed into already verified memory blocks without performing additional verification on the already verified memory blocks. Upon determining that the amount of verified memory blocks is less than the amount of memory blocks required to support the high performance data program operation, the method proceeds with an operation for performing a verification process on a number of additional memory blocks that have not yet been verified, such that the amount of verified memory blocks is at least equal to the amount of memory blocks required to support the high performance data program operation. And, the operation for performing the verification process on the number of additional memory blocks is performed during normal operation of the computer memory.

In one example embodiment, a method is disclosed for operating a computer memory. The method includes an operation for performing a verification process on a number of memory blocks. The verification process determines whether or not a given memory block contains a defect that inhibits correct reading of data programmed into the given memory block. The verification process is performed during normal operation of the computer memory. The method also includes an operation for reserving a number of memory blocks that pass the verification process as high performance memory blocks for use in high performance data program operations. The method also includes an operation for receiving a request to program data into the computer memory. The method also includes an operation for determining whether the request to program data is for a regular performance data program operation or for a high performance data program operation. Upon determining that the request to program data is for a high performance data program operation, the method proceeds with an operation for using one or more of the high performance memory blocks to store the data in the request. Upon determining that the request to program data is for a regular performance data program operation, the method proceeds with an operation for using one or more regular performance memory blocks to store the data in the request, and respectively applying a verification mode to each of the one or more regular performance memory blocks used to store the data in the request. The applied verification mode is either no verification, delayed verification, or immediate verification.

In one example embodiments, a computer memory controller is disclosed as including a high performance verification module and a performance determination module. The high performance verification module is configured to perform a verification process on memory blocks of the computer memory. The verification process is defined to determine whether or not a given memory block contains a defect that inhibits correct reading of data programmed into the given memory block. The high performance verification module is configured to reserve a number of memory blocks that pass the verification process as high performance memory blocks for use in high performance data program operations. The high performance verification module is also configured to monitor a number of available high performance memory blocks that are free for storage of incoming data. And, the high performance verification module is configured to perform the verification process on an additional number of memory blocks upon determining that the number of available high performance memory blocks is less than a minimum number of memory blocks required to support the high performance data program operation. The high performance verification module is configured to reserve the additional number of memory blocks that pass the verification process as high performance memory blocks for use in the high performance data program operation. The performance determination module is configured to determine whether an incoming request to program data is for a regular performance data program operation or for the high performance data program operation. Upon determining that the incoming request is for the high performance data program operation, the performance determination module directs use of one or more of the reserved high performance memory blocks for storage of the data in the incoming request.

Other aspects of the invention will become more apparent from the following detailed description, taken in conjunction with the accompanying drawings, illustrating by way of example the present invention.

DETAILED DESCRIPTION

Figure 1:
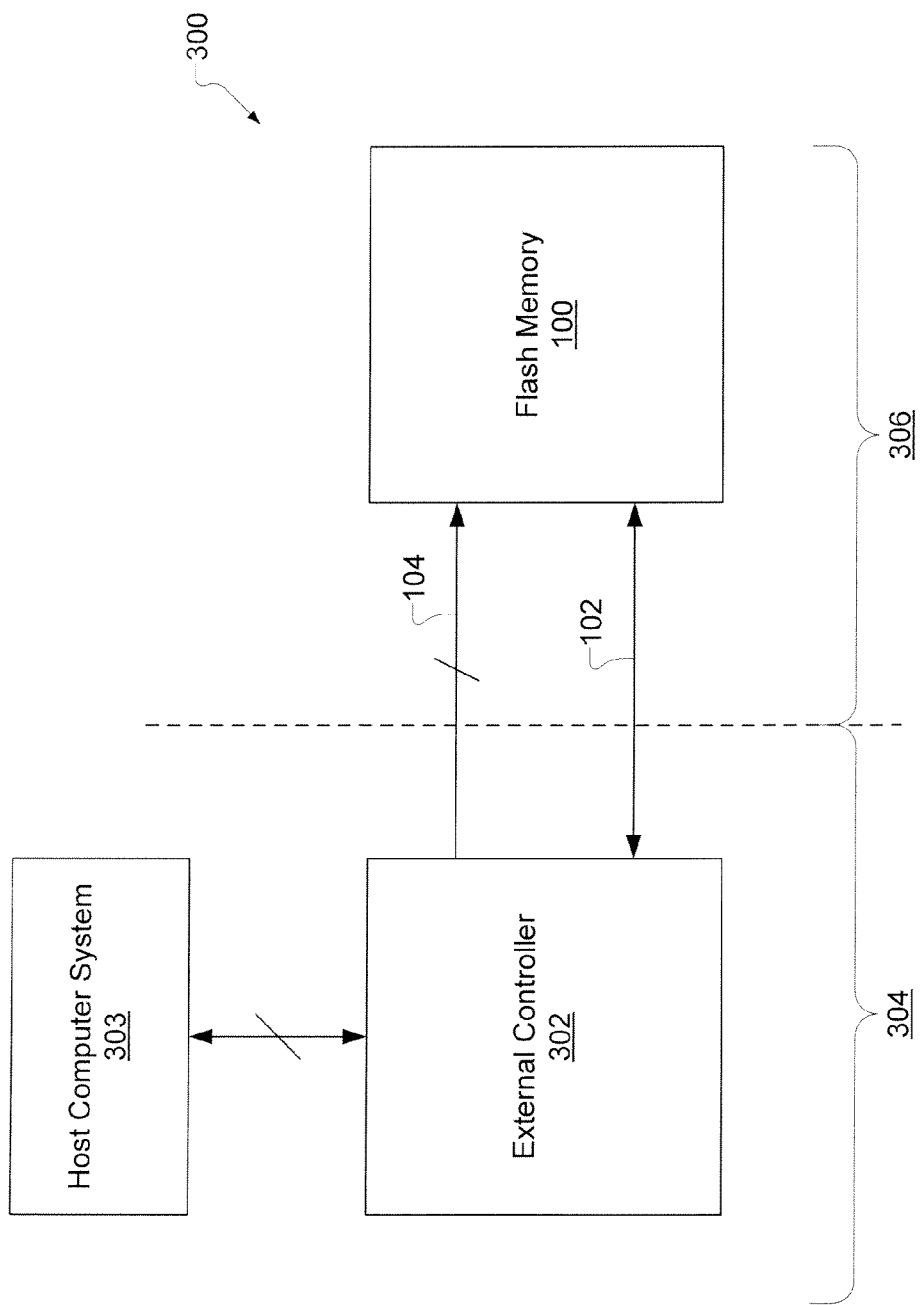
FIG. 1 shows a high-level schematic block diagram of a NAND-based flash memory device in which a flash memory is controlled by an external controller, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Two main approaches can be used to mitigate flash defects: 1) preventing use of memory blocks within the memory device that contain defected word lines, and 2) recovering programmed data after it is corrupted by a defected word line. Both approaches require a method for detecting defects in the word lines of memory blocks. To prevent use of memory blocks that contain defected word lines it is necessary to perform a defect detection process on the memory blocks to expose the defected word lines before using the memory blocks for storage of user data. The defect detection process is referred to herein as a "verification process." Also, when attempting to recover data after its corruption by a defected word line, the verification process is needed to identify the presence of the defected word line in order to then initiate the recovery process.

One approach to prevent use of memory blocks containing defected word lines is to screen the memory blocks for defects during production before the memory device is released for use by an end user. This approach of performing defect screening during production is referred to as in-production burn-in of the memory device. During the in-production burn-in approach, the memory device is cycled by programming the array of memory blocks with dummy data, reading the data from the programmed memory blocks, and comparing the read data with the original dummy data to identify the memory blocks containing word lines that have defects. If too many defects are identified in a given memory device, the memory device is declared to be defective and is not released from production.

The memory cells in flash memory devices have a finite lifetime measured by an expected number of program and erase cycles through which a given memory cell can be exercised before failure of the memory cell. Because the in-production burn-in approach requires programming of dummy data into memory cells, the in-production burn-in approach consumes some of the available program and erase cycles of the memory cells and thereby reduces the lifetime of the memory device that is available to the end user upon release of the memory device from production. An assumption made for the in-production burn-in approach is that a few program and erase cycles are needed to expose the defects in the word lines of the memory blocks. However, this assumption may not always be valid. Therefore, with the in-production burn-in approach, it is possible that some defects may not be detected and, as a result, the desired level of DPPM may not be achieved.

While the in-production burn-in approach may reduce DPPM by detecting some defects before releasing the memory device from production, it should be understood that the in-production burn-in approach reduces the overall endurance of the memory device available to the end user. Therefore, during the in-production burn-in process, a trade-off exists between the number of defects that can be detected and how many of the finite number of available program and erase cycles are used. Additionally, the in-production burn-in process requires dedicated testers and time, which increases the overall cost of the memory device. Therefore, while the in-production burn-in process can be useful to detect defects in the memory, it has a measurable cost in terms of reduction of memory device lifetime, increased production time, and increased cost.

One approach to recover data after its corruption is detected is to write triple-level-cell (TLC) data through binary single-level-cell (SLC) cache. In this approach, a copy of the data is maintained in the SLC cache, and this copy of the data is only released (erased) upon validation of the success of the folding of the SLC data into the TLC memory cells. In this approach, the folding process involves programming of data stored in three SLC memory cells into one TLC memory cell, such that three SLC pages are programmed as a single TLC page. However, this approach for recovering data does not serve to protect the data when it is originally stored in the SLC memory blocks. Therefore, for SLC memory blocks, other data recovery mechanisms are used.

Some data recovery mechanisms rely upon adding redundancy on the order of a complete logical page, maintained either in non-volatile or volatile memory. In such recovery mechanisms, the amount of redundant data storage required to protect a given amount of at-risk data is on the order of the amount of at-risk data. For example, in some embodiments, a RAID (redundant array of inexpensive disks) system is used to store a duplicate backup of the at-risk data that is stored in the SLC memory blocks. The RAID data recovery solution is primarily applicable to client storage solution (CSS) and enterprise storage solution (ESS) products in which a large amount of volatile RAM is available and a large amount of over-provisioning exists in non-volatile RAM. Also, in some devices that rely upon data redundancy for data recovery there may be a limited amount of RAM. In such devices, the redundancy storage area should be cleaned or erased from time-to-time, since the size of the memory is limited and should be operated in a manner to support programming of new data to the device in a protected manner.

When the redundancy storage area is to be erased or released for reuse, a verification of the data protected by the redundancy storage area should first be performed. Also, another trigger for performing verification of data is the erasure or release of data protected by a same redundancy, such as a data signature. For example, a data member of a data signature group associated with a data signature can only be recovered if all of the other data members of the data signature group exist along with the data signature. Therefore, it is appropriate to verify all the data members of the data signature group associated with the data signature before erasing or releasing any of the data members of the data signature group and/or before erasing or releasing the data signature. Such verification of data can adversely affect device performance because the verification process requires read operations to be added to the normal programming operations, thereby effectively lowering the programming speed of the memory device. Also, some verification approaches apply the same verification process to every word line for the entire lifetime of the memory device. Since the minimal unit of failure is a word line, the word line based verification process has a larger overhead relative to a block based verification process in which verification is performed for an entire memory block. Also, some verification processes cause the same memory device performance penalty every time they are performed, regardless of various parameters that may change in the memory to enable adjustment of the verification processes in order to reduce the memory device performance penalty.

Additionally, for some embedded flash drive products and/or removable memory products, there may not be enough RAM available to provide for data recovery through redundancy of data storage. In such products where RAM is limited, an alternative mechanism such as RBAX (Recovery by Accumulated XOR) may be used. RBAX requires fixed volatile resources independent of the size and writing quantity of the memory. However, because the RBAX process inserts/adds read operations between the normal programming operations of the memory device, the RBAX process relies on a detection mechanism that may adversely affect the performance of memory device with regard to programming data.

A memory system includes two primary entities, namely a host and a controller. The host generates a data packet and transfers a temporary copy of the data packet to the controller to be stored in non-volatile memory and retrieved when needed. The non-volatile memory is subjected to physical defects that may occur as a result of the stress involved in the programming process to store the data in the non-volatile memory. The physical defects may render the data unreadable, and therefore not available to the user. One approach to deal with such an issue is to devise a recovery mechanism, such as RBAX, that reconstructs the lost data from another source. In general terms, this recovery mechanism may follow three steps: 1) data redundancy generation, 2) data verification, and 3) data reconstruction if a failure occurs.

With regard to step 1, data redundancy generation is performed after each data program request by the host by updating a data signature, which incorporates the data packet into another location in volatile or non-volatile memory in the system, in a manner that can be utilized by the data reconstruction algorithm in step 3. In some embodiments, the data signature is computed as the XOR sum of several data packets.

With regard to step 2, the data verification requires a method to detect a significant failure, i.e., a failure that is not correctable by regular error correction code (ECC) protecting the data packet, and upon detection of the significant failure trigger the data reconstruction of step 3. In some embodiments, the data verification method includes an attempt to read and decode the data after it has been programmed into the memory for storage. If the data is undecodable, then a significant failure has occurred and the data reconstruction of step 3 is triggered. In some embodiments, the data verification may include a bit error rate (BER) estimation, with comparison of the computed BER to a threshold BER. If the computed BER exceeds the threshold BER, the data reconstruction of step 3 is triggered.

With regard to step 3, the data reconstruction may include an algorithm that utilizes the data signatures generated in step 1 and the decodable parts of the data obtained from the memory system in order to reconstruct the lost data identified in step 2. In the case of an XOR sum based data signature, the algorithm may subtract each element in the data signature by performing another XOR operation of the same element with the data signature until the only element left in the processed data signature is the one identified as unreadable in step 2.

To address the problematic aspects of the in-production burn-in approach, methods are disclosed herein in which the in-production burn-in approach is not performed, and instead, a verification process is performed in an incremental manner on the memory blocks in the memory device during normal use of the memory device in order to ensure that enough memory blocks are pre-verified and trusted for use in high performance data program operations, such that the high performance data program operations can be performed without having to incur memory operational delays associated with performance of the verification process on the memory blocks during the high performance data program operations. In addition, methods are disclosed herein for performing the verification process on memory blocks in a strategic manner to reduce memory operational delays associated with the verification process.

In some embodiments, the verification process of a given memory block is determined to be unnecessary when the given memory block has already been subjected to a minimum required number of program and erase cycles without detection of data errors. Also, in some embodiments, the verification process is performed on a given memory block using a more aggressive programming trim such that the given memory block can be more quickly exercised through the minimum required number of program and erase cycles necessary for verification. In some embodiments, the verification process for a given memory block is delayed when the data stored in the given memory block is protected by other data stored in the memory device, where the other data may be an associated data signature and/or a duplicate of the data stored in the given memory block. Also, in some embodiments, the verification process for a given memory block is performed in an expedited manner by using a multiple word line sensing (MWS) process in which each word line of the given memory block is allocated to a given word line group, with the number of word line groups for the given memory block being less than its total number of word lines, thereby allowing for a single verification step to be performed for a given word line group and correspondingly reducing the memory operational time required to perform the verification process.

FIG. 1 shows a high-level schematic block diagram of a NAND-based flash memory device 300 in which a flash memory 100 is controlled by an external controller 302, in accordance with one embodiment of the present invention. It should be understood that the memory device 300 shown in FIG. 1 is provided as an example. In other embodiments, the invention disclosed herein can be equivalently practiced with variations of the memory device 300 of FIG. 1. And, in other embodiments, the invention disclosed herein can be practiced with memory devices 300 different from that shown in FIG. 1.

In the memory device 300, the external controller 302 is defined to be electronically connected to a host computer system 303, such as a personal computer, a digital camera, a personal digital assistant, or essentially any other type of computer device that includes a digital processor. The host computer system 303 transmits commands to the external controller 302, such as commands to program data (i.e., write data) to or read data from the flash memory 100. The host computer system 303 also provides data to be programmed to, i.e., stored in, the memory 100 to the external controller 302, and receives data read from the memory 100 from the external controller 302. The external controller 302 is defined to generate and transmit command signals 104 to the flash memory 100, such that the command signals 104 can be interpreted and executed by the flash memory 100. The external controller 302 is also defined to transmit data to the flash memory over an I/O (input/output) bus 102 for storage within the flash memory 100, and receive read data over the I/O bus 102 from the flash memory 100. Also, the external controller 302 can include a buffer memory for temporary storage of data being programmed to or read from the flash memory 100.

In one embodiment, the memory device 300 includes one integrated circuit chip 304 that includes the external controller 302, and one or more integrated circuit chips 306 that include the flash memory 100. In one embodiment, the flash memory 100 is defined on a single integrated circuit chip. However, it should be understood that in other embodiments, the flash memory 100 can be defined across multiple integrated circuit chips that are each connected to electronically communicate with the external controller 302. Also, it should be understood that the memory device 300 may be embedded as part of the host computer system 303, or may be included in a memory card that is removably insertable into a mating socket of the host computer system 303. Such a memory card may include the entire memory device 300, or portions of the memory device 300, with a remainder of the memory device 300 defined on other components interfaced with the host computer system and/or memory card.

Figure 2:
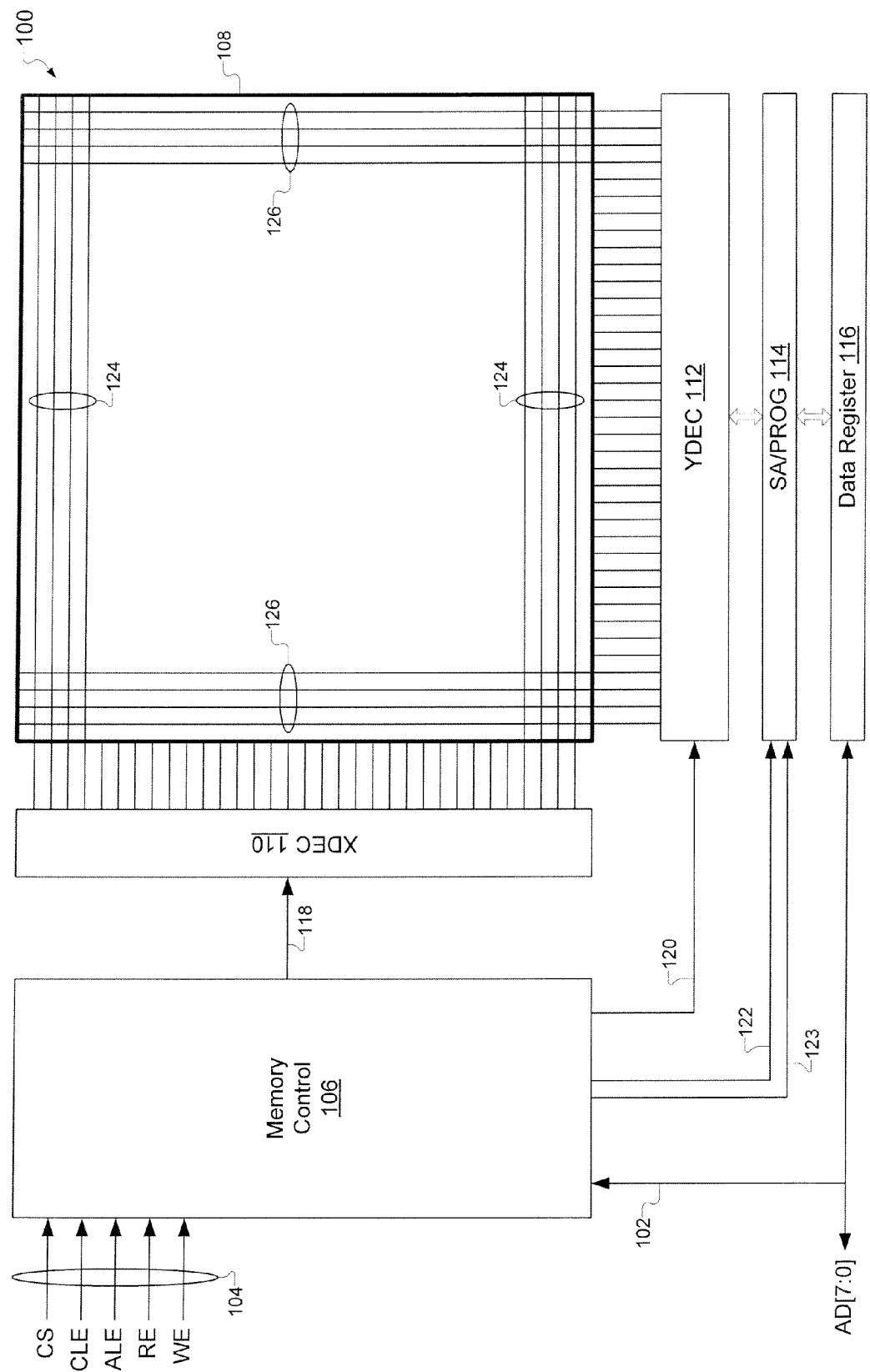
FIG. 2 shows an exemplary internal architecture for the flash memory, in accordance with one embodiment of the present invention.

FIG. 2 shows an exemplary internal architecture for the flash memory 100, in accordance with one embodiment of the present invention. The flash memory 100 includes a memory control circuit 106 defined to control internal memory operations. The memory control circuit 106 includes registers for command, address and status signals. The memory control circuit 106 is connected to receive signals on an input/output (I/O) bus 102 and to receive control signals 104 from the external controller 302. The flash memory 100 includes one or more arrays 108 of storage elements. In one embodiment, the storage elements within the array 108 are defined as flash EEPROM cells. Each array 108 storage element has an associated row decoder (XDEC) 110, an associated column decoder (YDEC) 112, an associated group of sense amplifiers and program control circuitry (SA/PROG) 114, and an associated data register 116.

In one embodiment, the control signals 104 include:
CS: Chip Select Signal: The CS signal is used to activate the flash memory 100 interface. If the CS signal is not asserted, the flash memory 100 will remain in standby mode and will not respond to other control signals.
CLE: Command Latch Enable Signal: The CLE signal controls the activating path for commands sent to the command register of the memory control circuit 106. When the CLE signal is asserted, commands are latched into the command register of the memory control circuit 106.
ALE: Address Latch Enable Signal: The ALE signal controls the activating path for addresses sent to the address register of the memory control circuit 106. When the ALE signal is asserted, addresses are latched into the address register of the memory control circuit 106.
RE: Read Enable Signal: The RE signal enables the data output buffers. When the RE signal is asserted, the read data is driven onto I/O bus 102.
WE: Write Enable Signal: The WE signal controls writing of data to the I/O port. Assertion of the WE signal provides for clocking of data, addresses, and/or commands into the flash memory 100.
AD[7:0]: Data on I/O bus 102: The I/O bus 102 is used to transfer data between a data bus controller and the flash memory 100 command, address, and data registers of the memory control circuit 106.

In addition to the above-mentioned control signals 104, the memory 100 also includes a means by which a storage subsystem controller may determine that the memory 100 is busy performing some task. Such means could include a dedicated signal or a status bit in an internal memory register that is accessible while the memory 100 is busy. It should be understood that the control interface defined by the above-mentioned control signals 104 is provided by way of example. In other embodiments, the control interface may include signals other than those discussed above to provide equivalent or expanded control of the memory 100. Additionally, it should be understood that while the example embodiment of FIG. 2 shows one flash memory array 108 with its associated components, other embodiments can include multiple arrays 108 as part of a given flash memory 100, where the multiple arrays 108 share a common interface 104 and memory control circuit 106, but have separate respective XDEC 110, YDEC 112, SA/PROG 14, and data register 116 circuitry in order to allow parallel read and program, i.e., write, operations.

During a read operation, data is transferred from the memory array 108 through the data register 116 to an external controller via the I/O bus 102. Data register 116 is also electrically connected to the SA/PROG (sense amplifier/programming) circuit 114. The number of storage elements of data register 116 that are connected to each SA/PROG circuit 114 element may depend on the number of bits stored in each storage element of the array 108. The SA/PROG circuit 114 is connected to a sense enable line 122 that when activated causes the SA/PROG circuit 114 to operate in a sense mode. Also, the SA/PROG circuit 114 is connected to a program enable line 123 that when activated causes the SA/PROG circuit 114 to operate in a program/verify mode.

The rows 124 of array 108 correspond to word lines. The columns 126 of array 108 correspond to bit lines. To avoid unnecessarily obscuring the array 108 of FIG. 2, only the first and last four rows 124 (word lines), and only the first and last four columns 126 (bit lines) are explicitly shown. However, it should be understood that the actual number of rows 124 (word lines) and columns 126 (bit lines) in the array 108 is dependent on the number of storage elements in the array 108, with each storage element have one row 124 (word line) and two columns 126 (bit lines). A storage element is positioned in the array 108 at each intersection of the rows 124 (word lines) and the columns 126 (bit lines). In one embodiment, the array 108 of storage elements includes one or more conductive floating gates as storage elements. However, in other embodiments, the array 108 of storage elements includes other types of long-term electron charge storage elements.

The row decoder XDEC 110 is defined to decode row addresses for array 108 in order to select the physical page to be accessed. The row decoder XDEC 110 receives row addresses via internal row address lines 118 from the memory control circuit 106. The column decoder YDEC 112 receives column addresses via internal column address lines 120 from the memory control circuit 106.

Figure 3:
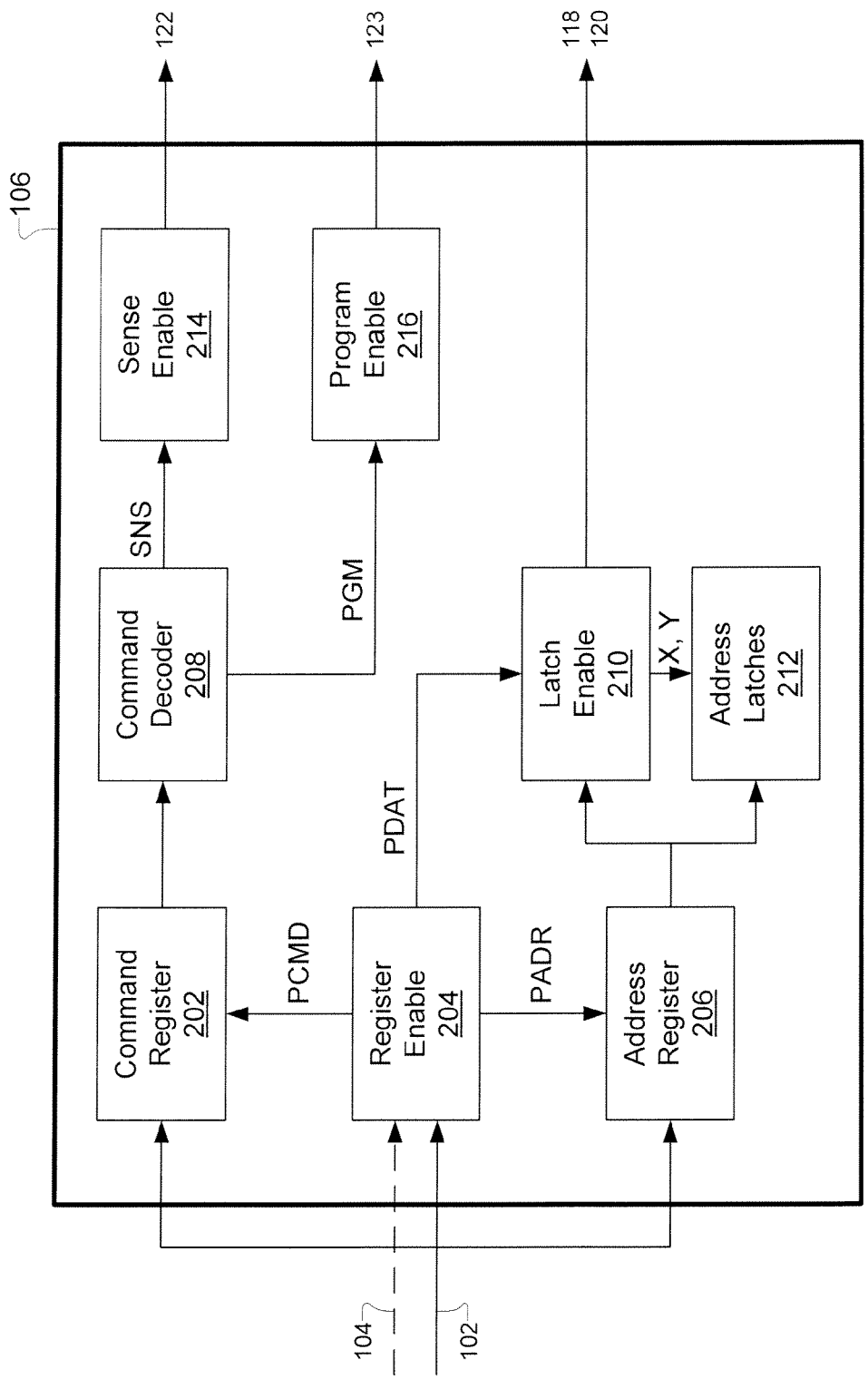
FIG. 3 shows a simplified block diagram of the memory control circuit, in accordance with one embodiment of the present invention.

FIG. 3 shows a simplified block diagram of the memory control circuit 106, in accordance with one embodiment of the present invention. The memory control circuit 106 includes a register enable circuit 204 that has outputs coupled to an address register 206, a command register 202 and a latch enable circuit 210, respectively. Upon receiving from the external controller an ALE control signal 104 indicating that an address descriptor is to follow, the register enable circuit 204 activates an enable line PADR (physical address register), which causes a subsequent chunk address descriptor received from the external controller over I/O bus 102 to be latched in to address register 206. The latch enable circuit 210, which is connected to the address register 206, then activates latch enable lines X and Y to latch the chunk address stored in address register 206 into appropriate row and column latches of address latches 212. The chunk addresses stored in address latches 212 are then provided over appropriate lines of internal row address lines 118 to row decoder XDEC 110, and over internal column address lines 120 to column decoder YDEC 112.

Upon receiving from the external controller a control signal 104 that indicates that data is to follow, i.e., that data is to be programmed/written into the memory array 108, the register enable circuit 204 activates an enable line PDAT (program data signal) that causes a chunk of data received over I/O bus 102 to be latched into the data register 116. Upon receiving from the external controller a CLE control signal 104 that indicates that a command is to follow, the register enable circuit 204 activates an enable line PCMD (program/write command), which causes a subsequent read or write command received from the external controller over I/O bus 102 to be latched into the command register 202.

A command decoder 208 then reads the command stored in command register 202. If the command is a program/write command, the command decoder 208 decodes the command to activate a program line PGM connected to a program enable circuit 216. The program enable circuit 216 receives the activate signal on the program line PGM and the most significant bit from the chunk address stored in address register 206. Then, the program enable circuit 216 transmits signals over the program enable lines 123 to the SA/PROG circuit 114, directing the SA/PROG circuit 114 to selectively activate its program/verify mode of operation to program the data in data register 116 into memory array 108.

If the command is a read command, the command decoder 208 decodes the command to activate a sense line SNS connected to a sense enable circuit 214 that in turn transmits signals over the sense enable line 122 to direct the SA/PROG circuit 114 to selectively activate its sense mode of operation to sense the threshold voltages stored in the storage elements at the intersections of the latched row 124 (word line) and the latched columns 126 (bit lines) of memory array 108. The results of the sensing are loaded into data register 116, for subsequent reading by the external controller.

In the flash memory 100, each storage element within the array 108 includes a transistor having both a control gate and a floating gate. It should be understood that the memory operation for storing data in the memory can be referred to interchangeably as a program operation, a write operation, or program/write operation. When data is programmed/written to the storage element, electrons are injected into the floating gate of the storage element's transistor. The injected electrons oppose a reference voltage applied to the control gate. The transistor of the storage element does not turn on, i.e., conduct, unless the reference voltage applied to its control gate is sufficiently high to overcome a charge present on its floating gate. The lowest voltage that can be applied to the control gate to overcome the charge on the floating gate is referred to as the threshold voltage of the transistor of the storage element.

The threshold voltage of a storage element resides within a voltage range extending from a minimum voltage (Vmin) to a maximum voltage (Vmax). The threshold voltage range of the storage element is divided into a number of voltage bins, where each voltage bin corresponds to a particular bit pattern stored in the storage element. A threshold voltage set within a particular voltage bin represents storage of a bit pattern that uniquely corresponds to the particular voltage bin. Therefore, the number of bits that can be stored by a given storage element is dependent upon the number of voltage bins into which the threshold voltage range is divided. More specifically, the threshold voltage range of a storage element that stores n bits is divided into 2n voltage bins. For each storage element in the array 108 that is operated in SLC mode, the value of n equals 1, and the storage element in SLC mode has 2 voltage bins. And, each storage element in the array 108 that is operated in MLC mode to store up to n bits of data has 2n voltage bins.

During a program/write operation, voltage pulses are applied to the transistor of the storage element to inject electrons into the floating gate of the storage element's transistor until a threshold voltage is established within the transistor of the storage element that exceeds a verify voltage level associated with a particular bit pattern to be stored within the storage element. During a read operation, the sensed threshold voltage of the storage element is compared to reference voltage levels that define the boundaries of the voltage bins into which the threshold voltage range is divided so as to identify the voltage bin in which the sensed threshold voltage resides, which in turn identifies the bit pattern stored in the storage element.

Figure 4:
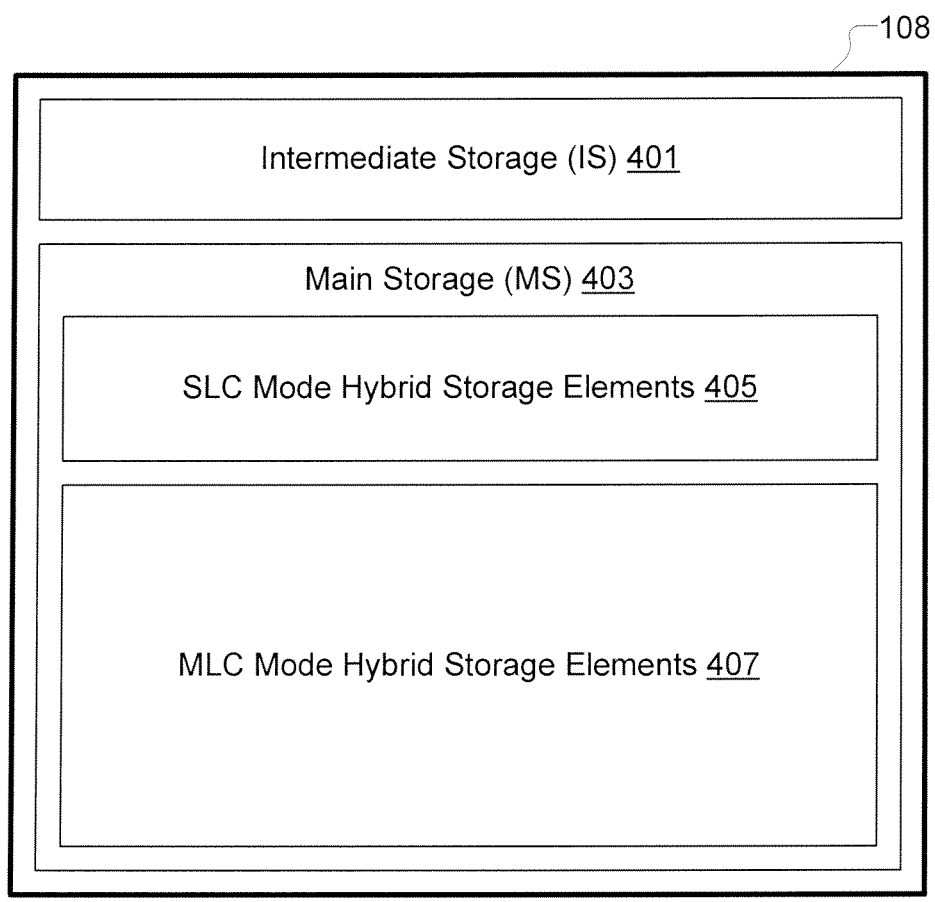
FIG. 4 shows an arrangement of storage elements within the array of the flash memory, in accordance with one embodiment of the present invention.

FIG. 4 shows an arrangement of storage elements within the array 108 of the flash memory 100, in accordance with one embodiment of the present invention. The array 108 includes an intermediate storage (IS) section 401 in which the storage elements are defined as SLC storage elements. The array also includes a main storage (MS) section 403 in which the storage elements are defined as MLC storage elements. More specifically, each storage element in the main storage (MS) section 403 is a hybrid storage element that can be operated in either SLC mode or MLC mode at any given time, as directed by the memory control circuit 106 according to the flash management needs and depending on the type of data (random data, sequential data, burst data) and content of the data and associated program/write command. Again, it should be understood that the terms "program" and "write" as used herein with regard to data storage in computer memory are synonymous and interchangeable.

When operated in SLC mode, the hybrid storage element stores 1 bit of data. When operated in MLC mode, the hybrid storage element can store multiple bits of data. For example, in eX2 flash memory technology, the hybrid storage element operated in MLC mode can store 2 bits of data. Also, in eX3 flash memory technology, the hybrid storage element operated in MLC mode can store 3 bits of data. The storage element operating in MLC mode to store 3 bits of data is also referred to as a triple-level-cell (TLC). It should be understood that a hybrid storage element operated in MLC mode, as referred to herein, can store 2 or more bits of data, and a hybrid storage element operated in SLC mode as referred to herein can store 1 bit of data. The main storage (MS) section 403 includes a sub-section of SLC mode hybrid storage elements 405, and a sub-section of MLC mode hybrid storage elements 407.

It should be understood that the separation between the SLC mode hybrid storage elements 405 and the MLC mode hybrid storage elements 407 within the main storage (MS) section 403 as shown in FIG. 4, is not intended to imply any limitation on physical location of SLC mode versus MLC hybrid storage elements within the main storage (MS) section 403. The depiction of the main storage (MS) section 403 in FIG. 4 showing the SLC mode hybrid storage elements 405 as being physically and/or logically organized separate from the MLC mode hybrid storage elements 407 corresponds to one example embodiment provided for ease of description. It should be understood that at any given moment, any of the hybrid storage elements within the entirety of the main storage (MS) section 403 can be controlled to operate in either SLC mode or MLC mode. Therefore, in other embodiments, it is not necessary for the SLC mode hybrid storage elements 405 to be physically and/or logically organized separate from the MLC mode hybrid storage elements 407 within the main storage (MS) section 403.

The intermediate storage (IS) section 401 can be operated as a safe-zone to store host data in SLC storage elements, or at least some of it, prior to programming/writing the host data to MLC storage elements 407 in the main storage (MS) section 403. When the intermediate storage (IS) section 401 becomes full of programmed data, or reaches a specified threshold amount of programmed data, an internal memory folding operation is performed to flush/relocate the programmed data from the intermediate storage (IS) section 401 to the MLC storage elements 407 in the main storage (MS) section 403.

Also, in addition to providing the safe-zone for storing host data, the SLC blocks of the intermediate storage (IS) section 401 can be used by the memory device 300 to provide burst performance to the host computer system 303. More specifically, because SLC storage elements can be programmed/written faster than MLC/hybrid storage elements, operating the memory device 300 to write more host data to the SLC storage elements of the intermediate storage (IS) section 401, as opposed to the MLC hybrid storage elements 407 of the main storage (MS) section 403, will increase the speed of the host data program/write operation, thereby freeing up the memory sooner for a subsequent operation to provide the burst performance. In some embodiments, the SLC storage elements can be programmed two times faster than the MLC storage elements that store 2 bits of data. And, in some embodiments, the SLC storage elements can be programmed four times faster than the MLC storage elements that store 3 bits of data.

In some embodiments, the host computer system 303 can direct the memory device 300 to operate in burst performance mode. In other embodiments, the memory device 300 is defined to detect when the host computer system 303 will benefit from burst performance and operate accordingly to self-actuate burst performance mode when appropriate. It should be understood that the intermediate storage (IS) section 401 is a smaller storage section in comparison to the main storage (MS) section 403, but the intermediate storage (IS) section 401 is a faster storage section in comparison to the main storage (MS) section 403, and is capable of operating as a limited capacity data caching area.

The hybrid storage elements of the main storage (MS) section 403 can be programmed in either SLC mode or MLC mode. After each block erase operation, it is possible to assign a given block of storage elements in the main storage (MS) section 403 to operate in either SLC mode or MLC mode, regardless of the mode in which the given block was previously operated. However, programming/writing a hybrid storage element in SLC mode has nearly the same endurance penalty as programming/writing the hybrid storage element in MLC mode. Therefore, if an MLC storage element has an expected lifetime of 2,000 P/E (program/erase) cycles, a given hybrid storage element will also have an expected lifetime of 2,000 P/E cycles, regardless of how many of the given hybrid storage element's P/E cycles are performed in SLC mode versus MLC mode.

As a point of comparison, a pure SLC storage element, such as in the intermediate storage (IS) section 401, can have an expected lifetime of 20,000 P/E cycles. Therefore, the hybrid storage elements of the main storage (MS) section 403 have a much lower endurance, i.e., expected lifetime, as compared to the SLC storage elements of the intermediate storage (IS) section 401. However, the main storage (MS) section 403 is generally much bigger than the intermediate storage (IS) section 401. For example, in one embodiment, the intermediate storage (IS) section 401 can be defined to store about 50 SLC blocks per plane, out of 1000 blocks per plane. Therefore, when it is required to program/write host data in SLC mode, for capacity reasons it may be advantageous or necessary to program/write the host data to the SLC mode hybrid storage elements 405 in the main storage (MS) section 403, as opposed to the SLC storage elements in the intermediate storage (IS) section 401. Generally speaking, when a given hybrid storage element of the main storage (MS) section 403 is operated in SLC mode the given hybrid storage element will have a performance, e.g., program/write speed, similar to the SLC storage element of the intermediate storage (IS) section 401, but even in the SLC mode the given hybrid storage element 405 will retain the lower endurance of the MLC storage element.

As discussed above, the SLC storage elements of the intermediate storage (IS) section 401 provide fast program/write speed and long endurance, whereas the SLC mode hybrid storage elements 405 of the main storage (MS) section 403 also provide fast program/write speed but shorter endurance. Although the programming speeds of the SLC storage elements of the IS section 401 and of the SLC mode hybrid storage elements 405 of the MS section 403 are comparable because they are both SLC programming operations, the difference in their endurance requirements provides opportunity for even faster programming in the SLC mode hybrid storage elements 405 as compared to the SLC storage elements of the IS section 401. Also, the IS section 401 may be limited in size/storage capacity, whereas the size/storage capacity of the SLC mode hybrid storage elements 405 in the MS section 403 can be larger, and in some embodiments can be adjusted as needed.

In an example embodiment of the present invention a memory device is released from production without performing the in-production burn-in process on the memory device. In this case, the various memory blocks within the memory device have not been verified as being free of flash defects before the memory device is released for use by the end user. However, a method is implemented by the memory controller of the memory device to ensure that data programmed into the memory device is protected, and to ensure that memory device provides the necessary performance during both regular performance data program operations and high performance data program operations. The memory controller is configured to distinguish between regular performance data program operations and high performance data program operations. The methods disclosed herein effectively distribute the flash defect screening process among the memory devices released from production, thereby avoiding the cost associated with the in-production flash defect screening. Also, the methods disclosed herein effectively bridge the gap between costly in-production flash defect screening and data recovery methods that may impact performance of the memory device.

A high performance data program operation is a feature offered by the memory controller to bring the user a better usage experience, by programming, i.e., writing, a sequence of data packets fast. For example, if the user takes a picture, then it is safe to assume that the user's concentration is on this task alone, and saving it fast to memory should be appreciated. On the contrary, if several applications are running on the user's device concurrently, and they wish to perform their own management writes, it is safe to assume that the user will not notice if these actions are performed faster. An implementation of the high performance data program operation may include the following: 1) write/program to blocks presenting the fastest programming times, e.g., SLC on hybrid block and no immediate verification, and 2) allocate every computing resource toward the task at hand, i.e., not suspending the current write/program operation for the sake of other operations before this high priority current write/program operation finishes. Since the computing resources may be limited, and eventually other tasks should also take place, the memory controller is configured to determine when to initiate the high performance data program operation and when to halt it. In some embodiments, the user, through the host-memory protocol, may provide an indication to the memory controller of the importance of the transmitted data, in order to trigger the high performance data program operation. In some embodiments, the memory controller may determine on its own that the data should be written/programmed in a high performance data program operation. For example, such a determination by the memory controller may be based on identifying multiple data packets that belong to consecutive logical memory addresses, i.e., the memory addresses that the host uses to identify the location of these data parts. The high performance data program operation may then be used as long as system resources are available. Also, in some embodiments, the memory controller can be configured to switch from the high performance data program operation back to the regular performance data program operation, if the resources needed to perform the high performance data program operation can no longer be provided.

When the memory controller identifies an incoming program request as being for a regular performance data program operation, a verification process is performed at the time of programming the data into the memory to ensure that the data can be read back in an error-free manner from the memory blocks in which it is stored. For example, in some embodiments, an enhanced post write read (EPWR) verification process can be performed in conjunction with a regular performance data program operation. Generally speaking, in the EPWR verification process, a representative of the programmed data is read and a BER estimation is performed on the read data to determine if too many errors are present. It should be understood, however, that other verification processes can also be used, so long as the verification process ensures that the data programmed into the memory block can be read back in an error-free manner prior to releasing a protective copy of the data received with the incoming program request. Therefore, the memory blocks used for regular performance data program operations are subjected to a verification process as each incoming data program request is processed. If a given memory block used for regular performance data program operations is found to have a defect during any verification process, the data associated with the received program request is written to another memory block that does not exhibit a flash defect. In this manner, the memory blocks used for regular performance data program operations are verified as they are programmed during normal use of the memory device.

Eventually, as more data is programmed into a given memory block, the given memory block will have been subjected to a sufficient number of verification operations for the controller to deem the given memory block as being free of any fatal flash defect. At this point, the memory controller can designate the given memory block as being defect free, and future verification of the given memory block can be avoided for subsequent data program operations using the given memory block. In this manner, with enough use of the memory device, it is possible for all memory blocks in the memory device to have been sufficiently verified so as to have each memory block designated as either being free of any fatal flash defect or as not being available for use due to it containing a fatal flash defect. At this point, the entire memory device available for use in regular performance data program operations will have been verified and no further verification processes will be performed by the memory controller for regular performance data program operations.

The memory controller is defined to handle verification of memory blocks used for high performance data program operations in a different manner than memory blocks used for regular performance data program operations. The memory controller is configured to designate a number of memory blocks for use in high performance data program operations. It should be understood that the structure of the memory block is the same regardless of whether the memory block is designated for use in high performance data program operations or for use in regular performance data program operations. For ease of description, the memory blocks that are designated for use in high performance data program operations are referred to as high performance memory blocks, and the memory blocks designated for use in regular performance data program operations are referred to as regular performance memory blocks.

In some embodiments, the number of high performance memory blocks is set just large enough to handle the anticipated high performance data program operation load of the memory device. The memory controller is configured to maintain the set number of high performance memory blocks that are free for use during operation of the memory device. Therefore, as some high performance memory blocks are used for high performance data program operations, the memory controller will designate additional memory blocks as high performance memory blocks in order to maintain the minimum number of available high performance memory blocks required to support high performance data program operations.

Unlike the memory blocks used for regular performance data program operations, the high performance memory blocks are not verified at the time of programming real user data. Rather, the memory controller directs performance of a pre-verification process on each of the designated high performance memory blocks, such that each of the high performance memory blocks can be trusted to safely store data during the high performance data program operation without the need for verification at the time of programming of the high performance memory blocks. In this manner, the memory device is not slowed down during the high performance data program operation by having to perform additional read operations as part of a verification process. In contrast to the high performance data program operation, for the regular performance data program operation the memory controller can absorb the additional read operations performed as part of the verification process without adversely impacting performance of the application that is utilizing the memory device.

Because the verification process performed on the high performance memory blocks is directed by the memory controller while the memory device is in actual real-world use, this verification process can be referred to as an "online burn-in process." It should be understood that the online burn-in process differs from the in-production burn-in process in that the online burn-in process is directed by the memory controller, and is performed during normal operation of the memory device, and involves performing validation on a limited number of memory blocks at a time in an incremental manner. In some embodiments, the online burn-in process can be implemented as part of the management firmware of the memory controller.

In the online burn-in process, each memory block in the designated set of high performance memory blocks is programmed with dummy data, then the data is read back from the memory block and compared with the original dummy data to determine whether or not a flash defect exist in the memory block. In some embodiments, the dummy data can be randomly generated in order to avoid systematic and/or erroneous artifacts in the verification process. The programming of dummy data, reading back of the data, and comparing of the read data with the original dummy data defines a verification cycle. Because flash defects grow as a memory cell is programmed and erased, for a given high performance memory block to be verified as being free of defects, the given high performance memory block is subjected to a minimum number of verification cycles. If the high performance memory block completes the minimum number of verification cycles without detection of a defect, the high performance memory block is considered to be defect-free, verified, and trusted to store data without need for future verification. Therefore, the high performance data program operation using the verified high performance memory blocks can be performed in a more rapid manner without having to be slowed down by the additional read operations that would be required to perform the verification process at the time of programming, such as happens in the regular performance data program operation.

In some embodiments, during performance of the online burn-in process, each word line in a memory block is verified by having dummy data programmed into the word line and read back from the word line for checking of correctness. In some embodiments, if any word line in the memory block is found to have a defect, the entire memory blocks is flagged as being inoperable and is taken out of use by the memory controller. Also, it should be understood that in some embodiments as data comes in for programming into the memory, the data is first programmed into SLC memory blocks. Therefore, the online burn-in process discussed herein for high performance data memory blocks is performed on memory blocks operated in SLC mode.

In some embodiments, the verification of high performance memory blocks is performed on a number of memory blocks just sufficient enough to handle a next incoming high performance data program operation, such as a burst mode programming operation. And, the memory controller monitors usage of the high performance memory blocks and continues to verify additional memory blocks as needed such that the number of high performance memory blocks is maintained at just enough to handle a next incoming high performance data program operation. In other words, the online burn-in process is performed on enough memory blocks to support burst mode program operations, then the online burn-in process is halted until more memory blocks are needed to support additional burst mode program operations, at which time the memory controller will perform the online burn-in process on more memory blocks as needed. In this manner, the program and read operations required for the online burn-in process can be spread out over the operational time of the memory device.

In some embodiments, the number of memory blocks required to support high performance data program operations can be pre-determined and set in the memory controller. And, in some embodiments, the number of memory blocks required to support high performance data program operations can be determined by the memory controller and adjusted as the memory device is used, with the memory controller storing a current setting for the minimum required number high performance memory blocks that need to be available/free for use. In some embodiments the minimum required number high performance memory blocks that need to be available/free for use is set at a number between about 50 and about 100. However, it should be understood that in other embodiments, the minimum required number high performance memory blocks that need to be available/free for use, i.e., pre-verified and unused, can be set at any number that is appropriate for the memory device and the anticipated use of the memory device. In some embodiments, an electronic device using the memory device may utilize the high performance data programming capabilities of the memory device with a limit set on the amount of data transmitted in each high performance data programming operation. In these embodiments, the memory controller is better able to anticipate the minimum required number high performance memory blocks that need to be available/free for use. In this manner, because burst mode data traffic associated with high performance data programming operations has a limited amount of data per burst, it is possible to deactivate/halt the online burn-in process each time there is a sufficient number of verified high performance memory blocks available for use.

Performance of the online burn-in process does consume some resources and operational time of the memory device.

However, the memory controller can be configured to implement the online burn-in process in a manner that is transparent to the user of the memory device, i.e., to the application and/or electronic device that is using the memory device for data storage. For example, in some embodiments, the online burn-in process is performed when the memory device is not being heavily tasked with program and read operations. Also, by limiting the performance of the online burn-in process to verify just enough high performance memory blocks to keep up with the next anticipated high performance data program operation, the online burn-in process required at a given time can be performed and halted in a rapid manner. It should be appreciated that it is possible to reserve enough of the verified high performance memory blocks for use with the next high performance data program operation.

As previously discussed, the regular performance data program operations protect the programmed data by performing verification and/or recovery processes (such as RBAX) on the regular performance memory block at the time of programming the data therein. Therefore, it should be understood that the online burn-in process on high performance memory blocks is performed in conjunction with the regular performance data programming operations, and benefits from the memory controller's differentiation between high performance and regular performance data program operations. Also, it should be understood that the online burn-in process is performed while the memory device is in actual use by the end user based on profiling of the incoming data traffic as either being for a regular performance data program operation or for a high performance data program operation. As a result, the online burn-in process can be implemented in a manner that is transparent to the user of the memory device.

In some embodiments, other enhancements can also be utilized to reduce the overall impact of the online burn-in process on the performance of the memory device. For example, in some embodiments, the online burn-in process on a given memory block can be accelerated by using a more aggressive programming trim for the verification process. More specifically, if the given memory block is to be verified for high performance data program operation, the given memory block will be exercised through a fixed number (N) of program and erase cycles. For the first (N−1) program and erase cycles, the dummy data will be written to the given memory block using a programming trim that is more aggressive, i.e., faster, than the normal programming trim. And, the reading back of the programmed dummy data will not be performed for the first (N−1) program cycles. The programming trim defines how charge is injected into a given memory cell in order to program the given memory cell with a certain data state. By using larger/higher programming pulses, it is possible to program the memory cell faster by using fewer pulses. And, any programming accuracy that is lost by using the larger/higher programming pulses does not matter because for the first (N−1) program cycles of the online burn-in process the data is not read back for checking. In this manner, the first (N−1) program cycles of the online burn-in process of the given memory block are used to apply electrical stress to the memory cells within the given memory block.

Then, on the final (Nth) program cycle of the online burn-in process, the regular programming trim is used to program the dummy data into the given memory block. Then, the programmed data is subjected to a verification process. In some embodiments, the verification process includes reading of the programmed data from the given memory block and checking the read data against the original dummy data to determine if any errors exist and correspondingly if any flash defects exist in the given memory block. In some embodiments, the verification process includes reading of the programmed data and performing a BER estimation on the read data (without having to decode the data) to determine if an error exists and correspondingly if any flash defects exist in the given memory block. In some embodiments, the verification process includes performing the MWS process (without having to decode the data) to determine if an error exists and correspondingly if any flash defects exist in the given memory block. It should be understood, however, that in other embodiments the verification process can be performed in other ways so long as the verification process is capable of determining if an error exists and correspondingly if any flash defects exist in the given memory block.

If no defect is found, the given memory block is deemed verified and is trusted for use as a high performance memory block without need for additional verification. It should be appreciated that by using the aggressive programming trim for the first (N−1) program cycles in the online burn-in process of the memory block, it is possible to complete the online burn-in process of the memory block faster and thereby lessen the impact on memory device performance caused by the online burn-in process.

In some embodiments, the online burn-in process on a given memory block can be accelerated by using a multiple word line sensing process for the verification process. The multiple word line sensing process can be used when the data stored in the memory block is considered to be scrambled, i.e., unshaped, in that the population of logical states stored in the memory block is characterized by approximately 50% logical zeros and 50% logical ones. In the multiple word line sensing process, multiple word lines of the given memory block are combined for verification so as to reduce a total number of verification operations required for the given memory block. For example, if the memory block contains 100 word lines, the multiple word line sensing process can be performed to divide the 100 word lines into 25 groups of 4 word lines. The multiple word line sensing process includes reading of the word lines in a given group of word lines in a combined manner to generate a single read page having one or more properties that when analyzed may reveal whether or not any of the word lines in the given group of word lines has a defect. For example, consider that the number of logical zeros present in the single read page represents a property that when analyzed may reveal whether or not any of the word lines in the given group of word lines has a defect. In this example, the group of word lines contributing to the single read page may be determined to include a defective word line when the number (or percentage) of logical zeros is outside of a prescribed range, where the range may be defined as a percentage range of logical values present in the single read page, e.g., no less than X % of the logical values present in the single read page and no more than Y % of the logical values present in the single read page. In this example, if it is determined that the percentage of logical zeros present in the single read page is outside of the prescribed percentage range, then the word line group corresponding to the single read page is determined to include at least one defective word line. Then, a more detailed verification process, such as at the BER estimation, among others, can be performed on each word line of the group of word lines to locate the one or more specific word line(s) that have a defect.

It should be understood that the number of logical zeros present in the single read page is one example of many different properties of the single read page that can be used to detect a defect. In other example embodiments, the property of the single read page used to detect a defect can be any data property and/or characteristic that will exhibit a detectable condition, value, change, and/or behavior when a defect is present in any one of the word lines of the group of word lines associated with the single read page. It should be understood, that for the given memory block, with the multiple word line sensing process, the total number of read operations required to perform the online burn-in process is reduced. Therefore, by using the multiple word line sensing process for the online burn-in process, the overall amount of memory operational time required to complete the verification process can be reduced. It should be understood that the number of word lines (100) and number of word lines per group (4) used in the above example description of the multiple word line sensing process is provided by way of example to demonstrate the concept of the multiple word line sensing process and should not be considered limiting. Specifically, in other embodiments, there can be any number of word lines in a given memory block, and there can be essentially any number of word lines per group in performing the multiple word line sensing process.

Over time, as the memory device is used, the number of memory blocks used for regular performance data program operation will increase, as will the number of program and erase cycles performed on each memory block. Therefore, because verification is performed on each memory block each time it is used for a regular performance data program operation, each memory block will accumulate a number of verified program operations. When the number of verified program operations of a given memory block reaches a set threshold value, the given memory block can be considered verified and trusted such that no further verification is required when the given memory block is used for future data program operations, whether it be for a regular performance data program operation or for a high performance data program operation. Also, because each high performance memory block is verified through the online burn-in process, it is not necessary to perform additional future verification on the high performance memory blocks once they pass the online burn-in process.

Given the above, it should be understood that over time each memory block in the memory device will have either been verified as being free of flash defects or have been removed from service due to detection of a flash defect, and the memory device will subsequently function with all memory blocks in a verified state and without need for any further verification process or online burn-in process. At this point, the need to discriminate between regular performance data program operations and high performance data program operations may go away, with each operable memory block being verified as defect-free for use in either type of data program operation, and with the memory controller adjusting its operation accordingly.

Figure 5:
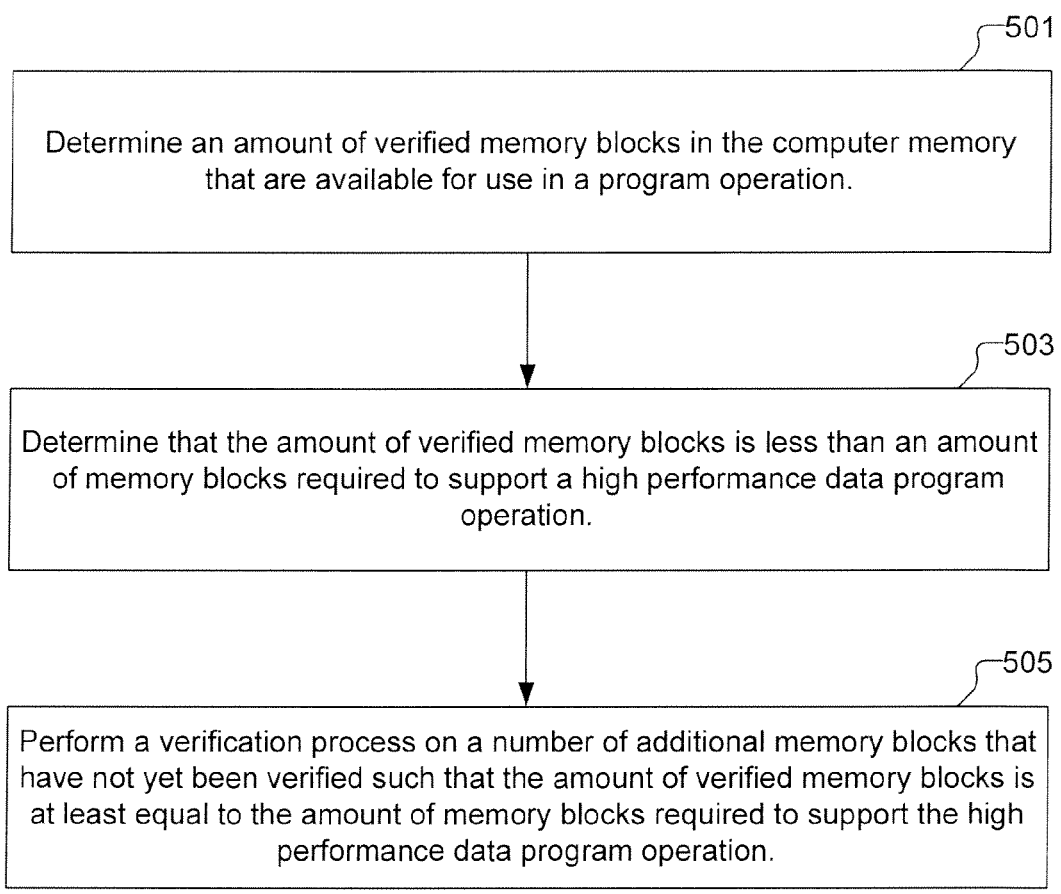
FIG. 5 shows a flowchart of a method for operating a computer memory, in accordance with an example embodiment of the present invention.

FIG. 5 shows a flowchart of a method for operating a computer memory, in accordance with an example embodiment of the present invention. The method includes an operation 501 for determining an amount of verified memory blocks in the computer memory that are available for use in a program operation. Each verified memory block has been verified as having no defects. The operation 501 is performed during normal operation of the computer memory. A defect exists in the memory block when data programmed into the memory block cannot be read correctly from the memory block. In some cases, the defect is caused by a physical defect in circuitry of the memory block. In some cases, the defect appears when the memory block has been subjected to electrical stress associated with programming and erasing of the memory block.

In some embodiments, each verified memory block is a memory block that has been exercised through a minimum required number of program and erase cycles without detection of a defect in the memory block. In some embodiments, the memory block is checked for defects after each program cycle of the minimum required number of program and erase cycles. In some embodiments, the minimum required number of program and erase cycles is within a range extending from about 50 to about 100. However, the minimum required number of program and erase cycles can be different in other embodiments.

The method also includes an operation 503 for determining that the amount of verified memory blocks is less than an amount of memory blocks required to support a high performance data program operation. In the high performance data program operation, data is programmed into already verified memory blocks without performing additional verification on the already verified memory blocks. Upon determining that the amount of verified memory blocks is less than the amount of memory blocks required to support the high performance data program operation, the method proceeds with an operation 505 for performing a verification process on a number of additional memory blocks that have not yet been verified such that the amount of verified memory blocks is at least equal to the amount of memory blocks required to support the high performance data program operation. In some embodiments, the number of additional memory blocks on which verification is performed is just enough to cause the amount of verified memory blocks to be substantially equal to the amount of memory blocks required to support the high performance data program operation. The operation 505 is performed during normal operation of the computer memory.

The verification process includes programming of the memory block with data followed by reading of the data from the memory block and analyzing the read data to determine whether or not an error exists in the read data. In some embodiments, analyzing the read data includes comparing the read data with a copy of the originally programmed data to determine whether or not a defect in the memory block prevented correct programming of the memory block. In some embodiments, analyzing the read data includes performing a bit error rate (BER) analysis on the read data to determine whether or not a defect in the memory block prevented correct programming of the memory block.

Figure 6:
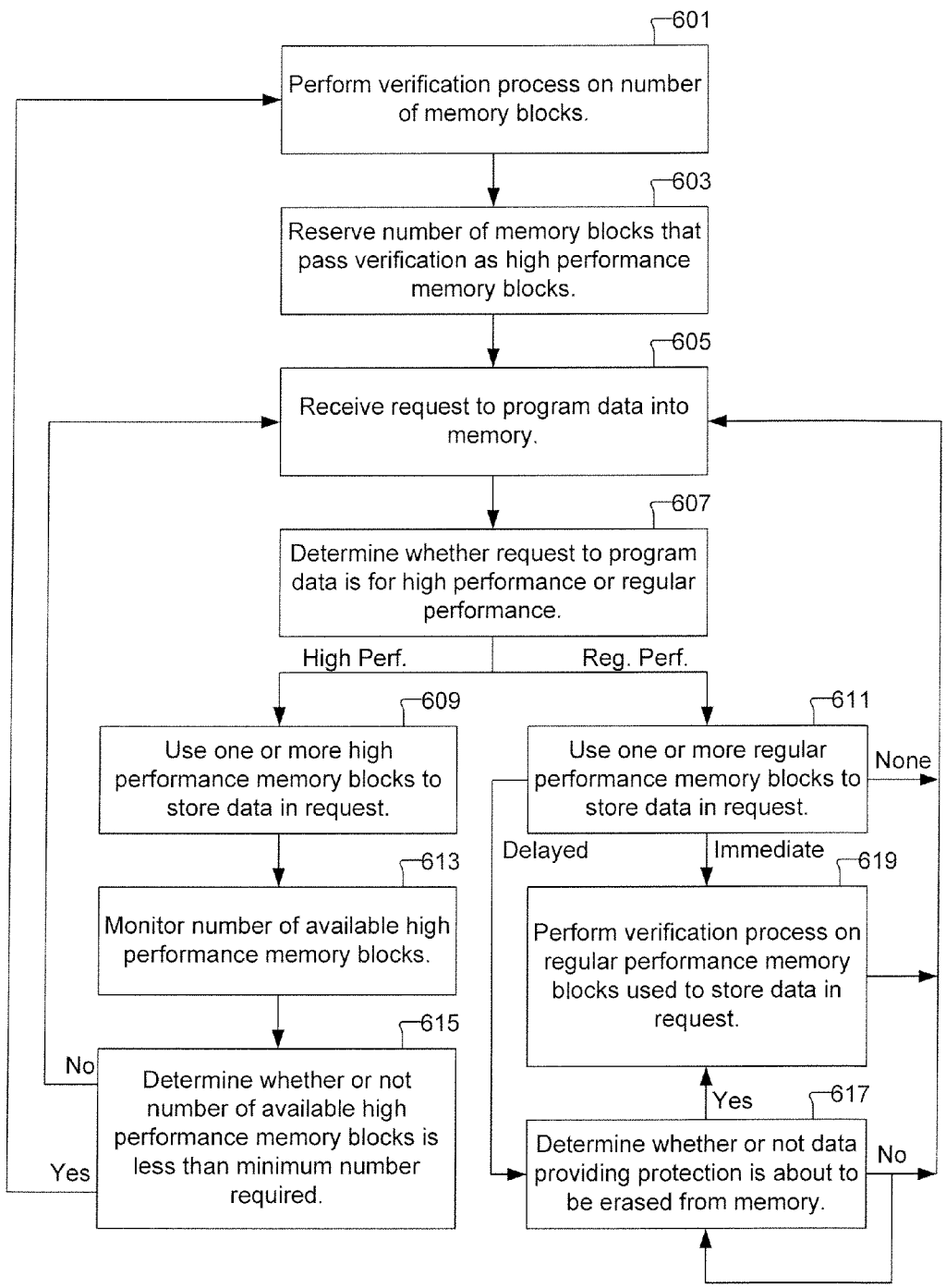
FIG. 6 shows a flowchart of a method for operating a computer memory, in accordance with an example embodiment of the present invention.

FIG. 6 shows a flowchart of a method for operating a computer memory, in accordance with an example embodiment of the present invention. The method includes an operation 601 for performing a verification process on a number of memory blocks. The verification process determines whether or not a given memory block contains a defect that inhibits correct reading of data programmed into the given memory block. The verification process is performed during normal operation of the computer memory. In some embodiments, the verification process is performed using a coarser and faster memory cell programming trim relative to a normal memory cell programming trim, so as to reduce an overall amount of memory operational time required to complete the verification process. In some embodiments, the verification process is performed using a multiple word line sensing process in which multiple word lines of a given memory block are combined for verification so as to reduce a total number of verification operations required for the given memory block, so as to reduce an overall amount of memory operational time required to complete the verification process. In some embodiments, the verification process performed on the given memory block includes exercising the given memory block through a minimum required number of program and erase cycles with checking of the given memory block for defects after each program cycle of the minimum required number of program and erase cycles, with a defect found to exist when data programmed into the given memory block on any program cycle cannot be read correctly from the given memory block.

The method also includes an operation 603 for reserving a number of memory blocks that pass the verification process in the operation 601 as high performance memory blocks for use in high performance data program operations. The method also includes an operation 605 for receiving a request to program data into the computer memory. The method also includes an operation 607 for determining whether the request to program data is for a regular performance data program operation or for a high performance data program operation. Upon determining that the request to program data is for a high performance data program operation, the method proceeds with an operation 609 for using one or more of the high performance memory blocks to store the data in the request.

The method can also include an operation 613 for monitoring a number of available high performance memory blocks that are free for storage of incoming data. The method can also include an operation 615 to determine whether or not the monitored number of available high performance memory blocks is less than a minimum number of memory blocks required to support high performance data program operation. Upon determining that the number of available high performance memory blocks is less than the minimum number of memory blocks required to support high performance data program operation, the method reverts back to the operation 601 for performing the verification process on an additional number of memory blocks, followed by operation 603 for reserving those of the additional number of memory blocks that pass the verification process as high performance memory blocks for use in high performance data program operations. And, if the operation 615 determines that the number of available high performance memory blocks is not less than the minimum number of memory blocks required to support high performance data program operation, the method reverts back to operation 605 for receiving another request to program data into the computer memory.

With reference back to the operation 607, upon determining that the request to program data is for a regular performance data program operation, the method proceeds with an operation 611 for using one or more regular performance memory blocks to store the data in the request, and respectively applying a verification mode to each of the one or more regular performance memory blocks used to store the data in the request. The applied verification mode is either no verification, delayed verification, or immediate verification.

In some embodiments, the verification mode of no verification is applied to a given memory block when it is determined that the given memory block has been used for a minimum required number of program and erase cycles with verification performed on the given memory block for each program cycle and without detection of a defect error in the given memory block. When the verification mode of no verification is applied in the operation 611, the data in the request is stored in the one or more regular performance memory blocks without performing any verification on the one or more regular performance memory blocks used to store the data, and the method reverts back to the operation 605 for receiving another request to program data into the computer memory.

In some embodiments, the verification mode of delayed verification is applied to a given memory block when it is determined that data programmed into the given memory block is protected by either a data signature currently stored in the computer memory and/or a copy of the data currently stored in the computer memory. When the verification mode of delayed verification is applied in the operation 611, the data in the request is stored in the one or more regular performance memory blocks without performing any verification on the regular performance memory blocks used to store the data, and the method proceeds with an operation 617 to determine whether or not the data signature, or any data contributing to the data signature, or the copy of the data used to protect the stored data is about to be erased from the computer memory. If the operation 617 determines that erasing of the data signature, or any data contributing to the data signature, or the copy of the data is not imminent, the method continues to perform the operation 617 as long as the delayed verification mode is applied to the regular performance memory blocks used to store the data, and in a simultaneous manner the method reverts back to the operation 605 for receiving another request to program data into the computer memory.

If the operation 617 determines that erasing of the data signature, or any data contributing to the data signature, or the copy of the data is imminent, the verification mode of the regular performance memory blocks used to store the data is changed from delayed verification to immediate verification, and the method proceeds with an operation 619. Therefore, it should be understood that the method operates to change the verification mode of delayed verification to the verification mode of immediate verification for the regular performance memory blocks used to the store the data in the program request when the data signature currently stored in the computer memory is about to be erased, or when any data contributing to the data signature currently stored in the computer memory is about to be erased, or when the copy of the data currently stored in the computer memory is about to be erased. When the method proceeds to the operation 619 from the operation 617, i.e., when the verification mode is changed from delayed verification to immediate verification, a verification process is performed on the regular performance memory blocks used to store the data in the program request before erasing either the data signature currently stored in the computer memory, or any data contributing to the data signature currently stored in the computer memory, or the copy of the data currently stored in the computer memory.

Also, when the verification mode of immediate verification is applied to the regular performance memory blocks in the operation 611, the method proceeds to the operation 619. In the operation 619 a verification process is performed on the regular performance memory blocks. In some embodiments, the verification process of operation 619 includes reading the data as programmed into a given regular performance memory block and calculating a bit error rate (BER) for the read data and determining whether or not the BER exceeds a threshold BER at which a defect condition is deemed to exist. Upon completion of the verification process in the operation 619, the method reverts back to the operation 605 for receiving another request to program data into the computer memory.

Figure 7:
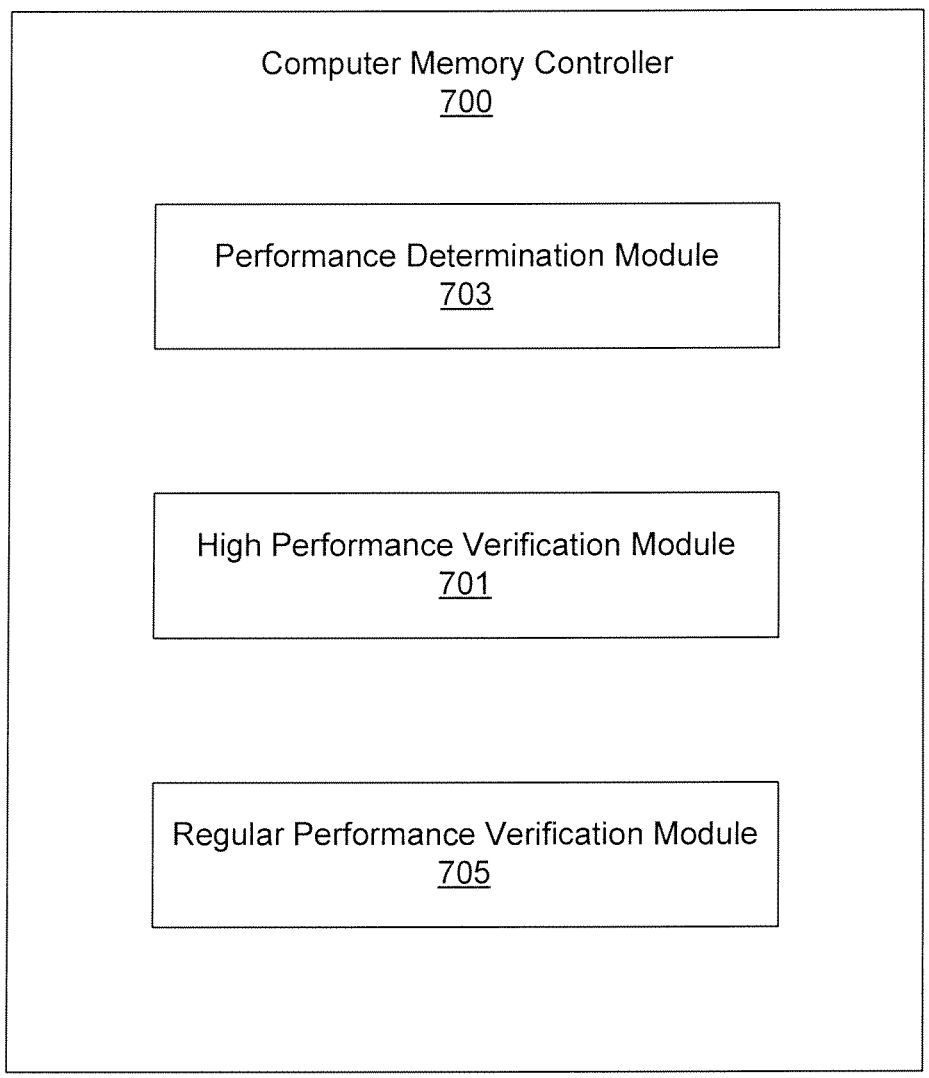
FIG. 7 shows a block-level architecture of a portion of a computer memory controller, in accordance with an example embodiment of the present invention.

FIG. 7 shows a block-level architecture of a portion of a computer memory controller 700, in accordance with an example embodiment of the present invention. It should be understood that the computer memory controller 700 can include many other components that are not shown in FIG. 7 in order not to obscure the description of the present invention. For example, in various embodiments, any of the components of the external controller 302 and/or memory control circuit 106 discussed with regard to FIGS. 1, 2, and 3 can also be included in the memory controller 700. The computer memory controller 700 includes a high performance verification module 701 configured to perform a verification process on memory blocks of the computer memory. The verification process is defined to determine whether or not a given memory block contains a defect that inhibits correct reading of data programmed into the given memory block. The high performance verification module 701 is configured to perform the verification process on the memory blocks during normal operation of the computer memory. The high performance verification module 701 is configured to reserve a number of memory blocks that pass the verification process as high performance memory blocks for use in high performance data program operations.

The high performance verification module 701 is configured to monitor a number of available high performance memory blocks that are free for storage of incoming data. The high performance verification module 701 is also configured to perform the verification process on an additional number of memory blocks upon determining that the number of available high performance memory blocks is less than a minimum number of memory blocks required to support the high performance data program operation. The high performance verification module 701 is configured to reserve the additional number of memory blocks that pass the verification process as high performance memory blocks for use in the high performance data program operation.

The computer memory controller 700 also includes a performance determination module 703 configured to determine whether an incoming request to program data is for a regular performance data program operation or for the high performance data program operation. Upon determining that the incoming request is for the high performance data program operation, the performance determination module 703 is configured to direct use of one or more of the reserved high performance memory blocks for storage of the data in the incoming request. The performance determination module 703 is further configured to direct use of one or more regular performance memory blocks to store the data in the incoming request upon determining that the incoming request is for the regular performance data program operation.

The computer memory controller 700 also includes a regular performance verification module 705 configured to apply a verification mode to each of the one or more regular performance memory blocks used to store the data in the incoming request, when the performance determination module 703 determines that the incoming request to program data is for the regular performance data program operation. The verification mode is either no verification, delayed verification, or immediate verification. The regular performance verification module 705 is configured to apply the verification mode of no verification to a regular performance memory block upon determining that the regular performance memory block has been used for a minimum required number of program and erase cycles with verification performed on the regular performance memory block for each program cycle, and without detection of a defect error in the regular performance memory block during performance of the minimum required number of program and erase cycles.

The regular performance verification module 705 is configured to apply the verification mode of delayed verification to a regular performance memory block when it is determined that data programmed into the regular performance memory block is protected by either a data signature currently stored in the computer memory or by duplicate data currently stored in the computer memory. The regular performance verification module 705 is also configured to change the verification mode of a regular performance memory block from delayed verification to immediate verification when either the data signature currently stored in the computer memory is about to be erased, or when data contributing to the data signature currently stored in the computer memory is about to be erased, or when the duplicate data stored in the computer memory is about to be erased. The regular performance verification module 705 is also configured to perform the verification process on the regular performance memory block before erasing either the data signature, the data contributing to the data signature, or the duplicate data.

In some embodiments, upon application of the verification mode of immediate verification to the regular performance memory block, the regular performance verification module 705 is configured to perform the verification process on the regular performance memory block using a coarser and faster memory cell programming trim relative to a normal memory cell programming trim, so as to reduce an amount of memory operation time required to complete the verification process. In some embodiments, upon application of the verification mode of immediate verification to the regular performance memory block, the regular performance verification module 705 is configured to perform the verification process on the regular performance memory block using a multiple word line sensing process in which data stored in multiple word lines of the regular performance memory block is combined for verification so as to reduce a total number of verification operations required for the regular performance memory block, so as to reduce an amount of memory operation time required to complete the verification process. In some embodiments, upon application of the verification mode of immediate verification to the regular performance memory block, the regular performance verification module 705 is configured to perform the verification process on the regular performance memory block by reading the data stored in the regular performance memory block, and calculating the BER for the read data, and determining whether or not the BER exceeds a threshold BER at which a defect condition is deemed to exist.

It should be appreciated that the methods presented herein implement verification processes (with regard to flash defects) on the memory blocks of the memory device based on multiple criteria in order to reduce the overall impact of the verification processes on the performance of the memory device. For example, differentiation is made between programming states (high performance versus regular performance) so as to optimize the verification process to the current programming state, with a corresponding reduction in overall verification time, thereby reducing the impact of the verification processes on the performance of the memory device.

As the number of program and erase cycles accumulate for a given memory block, the probability of growing a defect in a word line of the given memory block decreases. In some cases, the probability of growing a flash defect decreases with increasing program and erase cycles in accordance with a Weibull distribution. Therefore, it is possible to stop verifying word lines in memory blocks that have been sufficiently cycled without detection of a defect.

Also, the memory controller can partition the memory blocks by functionality. For example, in eX3 products, there may be pure TLC memory blocks, pure SLC memory blocks, and hybrid memory blocks that in some program and erase cycles appear as TLC memory blocks and in other program and erase cycles appear as SLC memory blocks. Some operation algorithms for eX3 products fold three SLC memory blocks into one TLC memory block, with data verification being performed during the folding process. Once the TLC memory block is verified and validated, the copy of the data in three SLC memory blocks can be released, i.e., erased. If a problem has occurred, such as corruption of data by a defect, the data can be obtained from the SLC memory blocks before they are released. In this manner, the data stored in the TLC memory blocks is protected by the data stored in the SLC memory blocks.

The data stored in the SLC memory blocks should also be protected. In some cases, the data stored in the SLC memory blocks is protected by copies of the data stored in volatile memory and/or by computed data signatures based on the stored data that provide for regeneration of the stored data if lost. The data stored in the SLC memory blocks should be verified before releasing the data redundancy that protects them, where such redundancy may be located in volatile memory in registers of the memory controller.

Hybrid memory blocks are qualified only for the lower TLC endurance level (e.g., 3,000 P/E cycles) and not for the higher SLC endurance level (e.g., 40,000 P/E cycles). Therefore, it is possible to use a more coarse programming trim for the SLC programming operations, which will be faster than the regular programming trim. The faster programming of the SLC memory blocks will help mitigate the performance penalty caused by the extra read operations of the SLC programming during performance of the verification process on the SLC memory blocks.

In some embodiments, a hybrid memory block is operated such that there can be only a few consecutive uses of the hybrid memory block in SLC mode after each use of the hybrid memory block in TLC mode. For example, the hybrid memory block may be operated to switch between TLC mode and SLC mode such that the hybrid memory block operates in one TLC program/erase cycle, followed by operation in three SLC program/erase cycles, followed by operation in one TLC program/erase cycle, followed by operation in three SLC program/erase cycles, and so on. The probability of discovering a defect in a given SLC program/erase cycle is expected to be low if the defect was not discovered in the previous TLC program/erase cycle. Therefore, in some embodiments, the hybrid memory block is operated such that the verification process is not performed during operation of the hybrid memory block in SLC program/erase cycles. This approach can also be used to reduce the impact of the verification processes on the performance of the memory device.

Also, some methods of performing verification processes with regard to discovery of flash defects can be performed faster than others. For example, some methods of verification are faster on average per word line by operating on the entire memory block once it is completely full, rather than by operating on each word line as the data is programmed into the memory block. One such method is the multiple word line sensing method as previously discussed. In some embodiments, the multiple word line sensing method includes sensing of word lines in groups of four word lines, with analysis performed on a group level to identify any unusual pattern in order to detect a group of word lines that contains one or more defected word lines. This particular embodiment of multiple word line sensing can decrease the average verification time per word line by approximately four. However, such multiple word line sensing should be used when the memory block contains unshaped data, i.e., scrambled data. Therefore, use of the multiple word line sensing verification process is contingent upon determining or knowing whether or not the stored data is shaped or unshaped.

Another approach for reducing the impact of the verification processes on the performance of the memory device is to delay verification whenever possible. For example, if a redundant snapshot of the data is stored in non-volatile memory, there is no need to verify the data when it is programmed into the memory. Then, a natural verification opportunity will arise when a read request is received for the stored data. If an error is detected in the stored data upon its reading, the lost/corrupted data can be retrieved in its original form from the redundant snapshot stored in the non-volatile memory. Also, if the redundant snapshots combine XOR signatures of word lines from different blocks, then a verification process may only be needed in the situation where any block that has word lines participating in a signature is going to be erased. Therefore, with storage of redundant snapshot data or redundant snapshot signatures, the verification process can be delayed until the occurrence of a special event, such as an erase operation that may eliminate the data protection afforded by the redundancy.

With regard to the redundant snapshot signatures mentioned above, duplication of memory can be avoided by assuming single failure at a time per word line group, such that the word line group can share a common redundancy XOR signature. Then, the XOR signature can be used to reconstruct a given word line of data when the other word lines of data from which the XOR signature is generated are known. The memory area used for data signatures may be limited. Therefore, the memory area used for data signatures may need to be released from time-to-time to accommodate new data signatures. Data signature release can be enabled after the word line group that it protects is verified.

It should be understood that the methods disclosed herein for operating a computer memory can be used with many different types of semiconductor memory devices. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure. In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are fainted or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate). As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device. One of skill in the art will recognize that the present invention is not limited to the two dimensional and three dimensional exemplary structures described herein but cover all relevant memory structures within the spirit and scope of the invention as described herein and as understood by one of skill in the art.

Various embodiments of the invention described herein can be embodied as hardware, firmware, and/or as computer readable code on a non-transitory computer readable medium. The non-transitory computer readable medium mentioned herein is any data storage device that can store data which can thereafter be read by a computer system. Examples of the non-transitory computer readable medium include hard drives, network attached storage (NAS), read-only memory, random-access memory, CD-ROMs, CD-Rs, CD-RWs, solid-state digital data storage devices, magnetic tapes, and other optical and non-optical data storage devices. The non-transitory computer readable medium can also be multiple data storage devices distributed over a network of coupled computer systems so that the computer readable code is stored and executed in a distributed fashion.

Any of the operations described herein that form part of the invention are useful machine operations. The invention also relates to a device or an apparatus for performing these operations. The device and/or apparatus may be specially constructed for the required purpose, such as a special purpose computer chip or computer. When defined as a special purpose computer chip or computer, the computer chip or computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the memory system implementing the methods as described herein with regard to verification processes, online burn-in processes, and/or verification process implementation strategies for improved memory device performance can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for operating a computer memory, comprising:
   determining, during normal operation of the computer memory, an amount of verified memory blocks in the computer memory that are available for use in a program operation, wherein each verified memory block is verified to not have any defect;
   determining that the amount of verified memory blocks is less than an amount of memory blocks required to support a high performance data program operation in which data is programmed into already verified memory blocks without performing additional verification on the already verified memory blocks;
   upon determining that the amount of verified memory blocks is less than the amount of memory blocks required to support the high performance data program operation, performing a verification process on a number of additional memory blocks that have not yet been verified until the amount of verified memory blocks is at least equal to the amount of memory blocks required to support the high performance data program operation.

2. The method as recited in claim 1, wherein each verified memory block is a memory block that has been exercised through a minimum required number of program and erase cycles without detection of a defect in the memory block.

3. The method as recited in claim 1, wherein the verification process includes programming of the memory block with data followed by reading of the data from the memory block and analyzing the read data to determine whether or not an error exists in the read data.

4. The method as recited in claim 3, wherein analyzing the read data includes comparing the read data with a copy of the originally programmed data.

5. The method as recited in claim 3, wherein analyzing the read data includes performing a bit error rate analysis on the read data.

6. The method as recited in claim 1, wherein the number of additional memory blocks on which verification is performed causes the amount of verified memory blocks to be equal to the amount of memory blocks required to support the high performance data program operation.

7. A method for operating a computer memory, comprising:
   performing a verification process on a number of memory blocks, the verification process determining whether or not a given memory block contains a defect that inhibits correct reading of data programmed into the given memory block, the verification process performed during normal operation of the computer memory;
   reserving a number of memory blocks that pass the verification process as high performance memory blocks for use in high performance data program operations;
   receiving a request to program data into the computer memory;
   determining whether the request to program data is for a regular performance data program operation or for a high performance data program operation;
   upon determining that the request to program data is for a high performance data program operation, using one or more of the high performance memory blocks to store the data in the request; and
   upon determining that the request to program data is for a regular performance data program operation, using one or more regular performance memory blocks to store the data in the request, and respectively applying a verification mode to each of the one or more regular performance memory blocks used to store the data in the request, the verification mode being either no verification, delayed verification, or immediate verification.

8. The method as recited in claim 7, wherein the verification mode of no verification is applied to a given memory block when it is determined that the given memory block has been used for a minimum required number of program and erase cycles with verification performed on the given memory block for each program cycle and without detection of a defect error in the given memory block.

9. The method as recited in claim 7, wherein the verification mode of delayed verification is applied to a given memory block when it is determined that data programmed into the given memory block is protected by a data signature currently stored in the computer memory or when it is determined that a copy of the data programmed into the given memory block is currently stored in another location in the computer memory.

10. The method as recited in claim 9, further comprising:
changing the verification mode of delayed verification to the verification mode of immediate verification when erasing of the data signature currently stored in the computer memory is imminent or when erasing of data contributing to the data signature currently stored in the computer memory is imminent or when erasing of the copy of the data programmed into the given memory block is imminent; and
performing the verification process on the given memory block before erasing either the data signature currently stored in the computer memory or the data contributing to the data signature currently stored in the computer memory or the copy of the data programmed into the given memory block.

11. The method as recited in claim 7, wherein the verification process is performed on a given memory block using a coarser and faster memory cell programming trim relative to a normal memory cell programming trim.

12. The method as recited in claim 7, wherein the verification process is performed on a given memory block using a multiple word line sensing process in which data stored in multiple word lines of the given memory block is combined for verification to reduce a total number of verification operations required for the given memory block.

13. The method as recited in claim 7, further comprising:
monitoring a number of available high performance memory blocks that are free for storage of incoming data; and
upon determining that the number of available high performance memory blocks is less than a minimum number of memory blocks required to support a high performance data program operation, performing the verification process on an additional number of memory blocks, and reserving those of the additional number of memory blocks that pass the verification process as high performance memory blocks for use in high performance data program operations.

14. A computer memory controller, comprising:
a high performance verification module configured to perform a verification process on memory blocks of the computer memory, the verification process defined to determine whether or not a given memory block contains a defect that inhibits correct reading of data programmed into the given memory block,
the high performance verification module configured to reserve a number of memory blocks that pass the verification process as high performance memory blocks for use in high performance data program operations,
the high performance verification module configured to monitor a number of available high performance memory blocks that are free for storage of incoming data,
the high performance verification module configured to perform the verification process on an additional number of memory blocks upon determining that the number of available high performance memory blocks is less than a minimum number of memory blocks required to support the high performance data program operation, the high performance verification module configured to reserve the additional number of memory blocks that pass the verification process as high performance memory blocks for use in the high performance data program operation; and
a performance determination module configured to determine whether an incoming request to program data is for a regular performance data program operation or for the high performance data program operation, and upon determining that the incoming request is for the high performance data program operation, directing use of one or more of the reserved high performance memory blocks for storage of the data in the incoming request.

15. The computer memory controller as recited in claim 14, wherein the performance determination module is further configured to direct use one or more regular performance memory blocks to store the data in the incoming request upon determining that the incoming request is for the regular performance data program operation.

16. The computer memory controller as recited in claim 15, further comprising:
a regular performance verification module configured to apply a verification mode to each of the one or more regular performance memory blocks used to store the data in the incoming request, the verification mode being either no verification, delayed verification, or immediate verification.

17. The computer memory controller as recited in claim 16, wherein the regular performance verification module is configured to apply the verification mode of no verification to a given regular performance memory block upon determining that the given regular performance memory block has been used for a minimum required number of program and erase cycles with verification performed on the given regular performance memory block for each program cycle and without detection of a defect error in the given regular performance memory block.

18. The computer memory controller as recited in claim 17, wherein the regular performance verification module is configured to apply the verification mode of delayed verification to a given regular performance memory block when it is determined that data programmed into the given regular performance memory block is protected by either a data signature currently stored in the computer memory or by duplicate data currently stored in the computer memory.

19. The computer memory controller as recited in claim 18, wherein the regular performance verification module is configured to change the verification mode of a given regular performance memory block from delayed verification to immediate verification when erasing of the data signature currently stored in the computer memory is imminent, or when erasing of data contributing to the data signature currently stored in the computer memory is imminent, or when erasing of the duplicate data stored in the computer memory is imminent,
the regular performance verification module configured to perform the verification process on the given regular performance memory block before erasing either the data signature, the data contributing to the data signature, or the duplicate data.

20. The computer memory controller as recited in claim 19, wherein upon application of the verification mode of immediate verification to the given regular performance memory block, the regular performance verification module is configured to perform the verification process on the given regular performance memory block by one or more of,
a) using a coarser and faster memory cell programming trim relative to a normal memory cell programming trim, b) using a multiple word line sensing process in which data stored in multiple word lines of the given regular performance memory block is combined for verification to reduce a total number of verification operations required for the given regular performance memory block, and
c) reading the data stored in the given regular performance memory block and calculating a bit error rate for the read data and determining whether or not the bit error rate exceeds a threshold bit error rate at which a defect condition is deemed to exist.

* * * * *